United States Patent [19]
Raszka

[11] Patent Number: 6,084,820
[45] Date of Patent: Jul. 4, 2000

[54] DUAL PORT MEMORY DEVICE WITH VERTICAL SHIELDING

[75] Inventor: Jaroslav Raszka, Fremont, Calif.

[73] Assignee: Virage Logic Corporation, Fremont, Calif.

[21] Appl. No.: 09/226,777

[22] Filed: Jan. 6, 1999

[51] Int. Cl.[7] .................................................. G11C 8/00
[52] U.S. Cl. ...................................... 365/230.05; 365/53
[58] Field of Search ................................. 365/53, 51, 63, 365/230.03, 230.05

[56] References Cited

U.S. PATENT DOCUMENTS

| | | | |
|---|---|---|---|
| 5,287,322 | 2/1994 | Rastegar | 365/230 |
| 5,563,820 | 10/1996 | Wada et al. | 365/62 |
| 5,808,930 | 9/1998 | Wada et al. | 365/63 |
| 5,936,875 | 8/1999 | Kim et al. | 365/51 |

*Primary Examiner*—David Nelms
*Assistant Examiner*—David Lam

*Attorney, Agent, or Firm*—Fenwick & West LLP

[57] ABSTRACT

A dual port memory device comprises a first group of bit lines corresponding to a first port of the device, a second group of bit lines corresponding to a second port of the device, and a vertical shielding layer disposed between the first group of bit lines and the second group of bit lines, for eliminating the capacitance coupling between the first group of bit lines and the second group of bit lines. The first group of bit lines are disposed in a first metal layer of the device, the vertical shielding is disposed in a second metal layer of the device, and the second group of bit lines are disposed in a third metal layer of the device. The present invention further comprises jumper lines for electrically connecting the bit lines in the metal layer above the vertical shielding layer to a diffusion well of a transistor. In addition, jumper windows are provided in the vertical shielding layer for allowing the jumper lines to pass through the vertical shielding layer.

20 Claims, 7 Drawing Sheets

DUAL PORT MEMORY DEVICE WITH VERTICAL SHIELDING

FIELD OF THE INVENTION

The present invention relates generally to semiconductor integrated devices, and more specifically to dual port memory devices.

DESCRIPTION OF THE PRIOR ART

SRAM memory components are used in many electronic applications requiring data storage. SRAM memory components comprise one or more memory bit cells ("cells") and circuitry to read and write digital bit values to the cells. The cells are connected to read and write circuitry by wires called bit lines. As is known in the art, the cells store a bit value and transfer the value to the bit line which causes it to change from "1" to "0" or from "0" to "1". One type of device which utilizes SRAM cells is a dual port SRAM device. Dual port SRAM devices typically comprise a memory array of SRAM cells and two ports for accessing the SRAM cells in the memory array. Referring now to FIG. 1, a schematic diagram of a typical dual port SRAM memory bit cell 100 is shown. SRAM cell 100 includes cross coupled N-channel latch transistors 102 and P-channel load transistors 104. Alternatively, resistive load devices are used in place of the P-channel transistors 104 as is known in the art. Cell 100 comprises bit lines 114, 116 which are coupled to a first port (Port A), and bit lines 118, 120 which are coupled to a second port (Port B). Port A access transistor 106 is coupled to bit line 114, with access transistor 108 being coupled to the complementary bit line 116. Port B access transistors 110 and 112 are coupled to Port B bit lines and complemented bit lines 118 and 120 respectively. Cell 100 is used to store a value as known in the art. The Port A and Port B bit lines access the same value of the cell 100. Thus, when a logical one is read from the cell 100 through Port A, Port B also reads out a logical one. Because dual port SRAM devices allow simultaneous access to the memory array by two different devices, they are ideally suited for transferring data between two processors or between two systems which operate according to different clock speeds.

One problem with current dual port SRAM devices is that they have relatively long bit lines which contribute significantly to increasing stray and cross coupling capacitances between the bit lines. Such capacitances impact device speed and performance. For example, referring again to the dual port SRAM cell 100 in FIG. 1, Port A may be performing a read on the cell 100 while Port B may be simultaneously performing a write on a cell in the same column. During the read on Port A, the signals on the bit lines 114, 116 are relatively small, requiring amplification by a sense amplifier (not shown). The writing process on Port B, however, uses approximately the full voltage swing available from the supply VDD. The much larger voltage used by Port B for a write operation can induce charge onto the adjacent bit lines for Port A 114, 116 resulting in cross coupled signal between the bit lines for Port A and the bit lines for Port B. Such cross coupled signal (also known as fringe or line-to-line) may result in possible errors during a read operation by Port A. Referring now to FIG. 2, a block diagram of a crosssectional view of the dual port SRAM cell 100 is shown. The cross section of cell 100 is taken in the Y–Y' direction. The distance X1 between bit lines 114 and 118 and the distance X2 between bit lines 120 and 116 illustrate the cross coupling capacitance which occurs between the bit lines for Port A and Port B. As is known in the art, such problems increase as semiconductor technologies are scaled down in size and the bit lines are placed closer together since the capacitance between bit lines in the same metal layer is much greater than the capacitance between different metal layers.

One solution in the prior art is to add a significant wait time between operation of either port to ensure that any stray and cross-coupled signals have dissipated. However, this solution reduces the operating frequency of the device and increases power consumption. Another solution is to run all bit lines in the same metal layer but provide for horizontal shielding between the bit lines for the different ports. Referring now to FIG. 3, a block diagram of a cross section of a dual port SRAM cell with horizontal shielding is shown. The horizontal shielding in FIG. 3 comprises the power supply lines VSS 304 and VDD 310. VSS 304 provides a horizontal shield between the A bit line 302 and the B bit line 306, while VDD 310 provides a horizontal shield between bit line B' and bit line A'. While this solution eliminates cross-coupling capacitances between bit lines from the different ports, it substantially increases the die area of the device thereby increasing costs. Moreover, the horizontal shielding adds capacitance to the bit lines adjacent to the horizontal shields. For example, the horizontal shield VSS 304 adds capacitance to bit line A 302 and bit line B 306, and the horizontal shield VDD 310 adds capacitance to bit line B' 308 and bit line A' 312.

Another solution to this problem is described in U.S. Pat. No. 5,287,322 entitled "Integrated Circuit Dual-Port Memory Device Having Reduced Capacitance" by Bahador Rastegar ("the '322 patent"). The '322 patent provides a bit line crossover scheme between a memory array which is divided into two halves. Referring now to FIG. 4, a top view of cross coupled bit lines of a portion of a memory array in accordance with the '322 patent is shown The bit line layout causes the data for one of the ports to be inverted in one-half of the array. When data from this half of the array is read or written by such port, the data being read or written must be inverted. Although the solution described in the '322 patent reduces stray and cross-coupling capacitances, it does not eliminate them. Although the crossover scheme results in coupling which is proportional to both sets of bit lines, cross coupling capacitance still exists between the bit lines for Port A and the bit lines for Port B. For example, if bit line A 402 is the aggressor line, bit line A 402 will couple to both bit line B (top of FIG. 4) and bit line B' (bottom of FIG. 4). As a result of the coupling, bit lines B and B' may not be in the optimal range for the sense amplifiers for the Port B. In this scenario, bit line A injects a common mode voltage in bit lines B and B' which may reduce the overall gain of the amplifier. Additionally, the capacitance between bit lines is still high which may reduce the overall speed and efficiency of the device. Furthermore, the solution described in the '322 patent is unduly complicated and difficult to implement in certain technologies, such as SRAM compiler technology.

Therefore, what is needed is a layout and design for a dual port memory device which eliminates stray and cross-coupling capacitances. Moreover, what is needed is a layout and design for eliminating such capacitances which is simple to implement and which does not increase die size.

SUMMARY OF THE INVENTION

The present invention comprises a dual port memory device for eliminating stray and cross-coupling capacitances between bit lines for different ports. The layout and design of the present invention is flexible and simple to implement and does not increase die size. A dual port memory device for eliminating capacitance coupling between bit lines for different ports comprises a plurality of bit lines which are grouped into a first group of bit lines corresponding to a first port of the device and a second group of bit lines corresponding to a second port of the device, and a vertical shielding layer disposed between the first group of bit lines and the second group of bit lines, for decreasing the capacitance coupling between the first group of bit lines and the second group of bit lines. Preferably, the first group of bit lines are disposed in a first metal layer of the device, the vertical shielding is disposed in a second metal layer, and the second group of bit lines are disposed in a third metal layer. The present invention further comprises jumper lines for electrically connecting the bit lines in the metal layer above the vertical shielding layer to a diffusion area of the device. In addition, jumper windows are provided in the vertical shielding layer for allowing the jumper lines to pass through the vertical shielding layer.

DETAILED DESCRIPTION OF THE PREFERRED EMBODIMENTS

Figure 1:
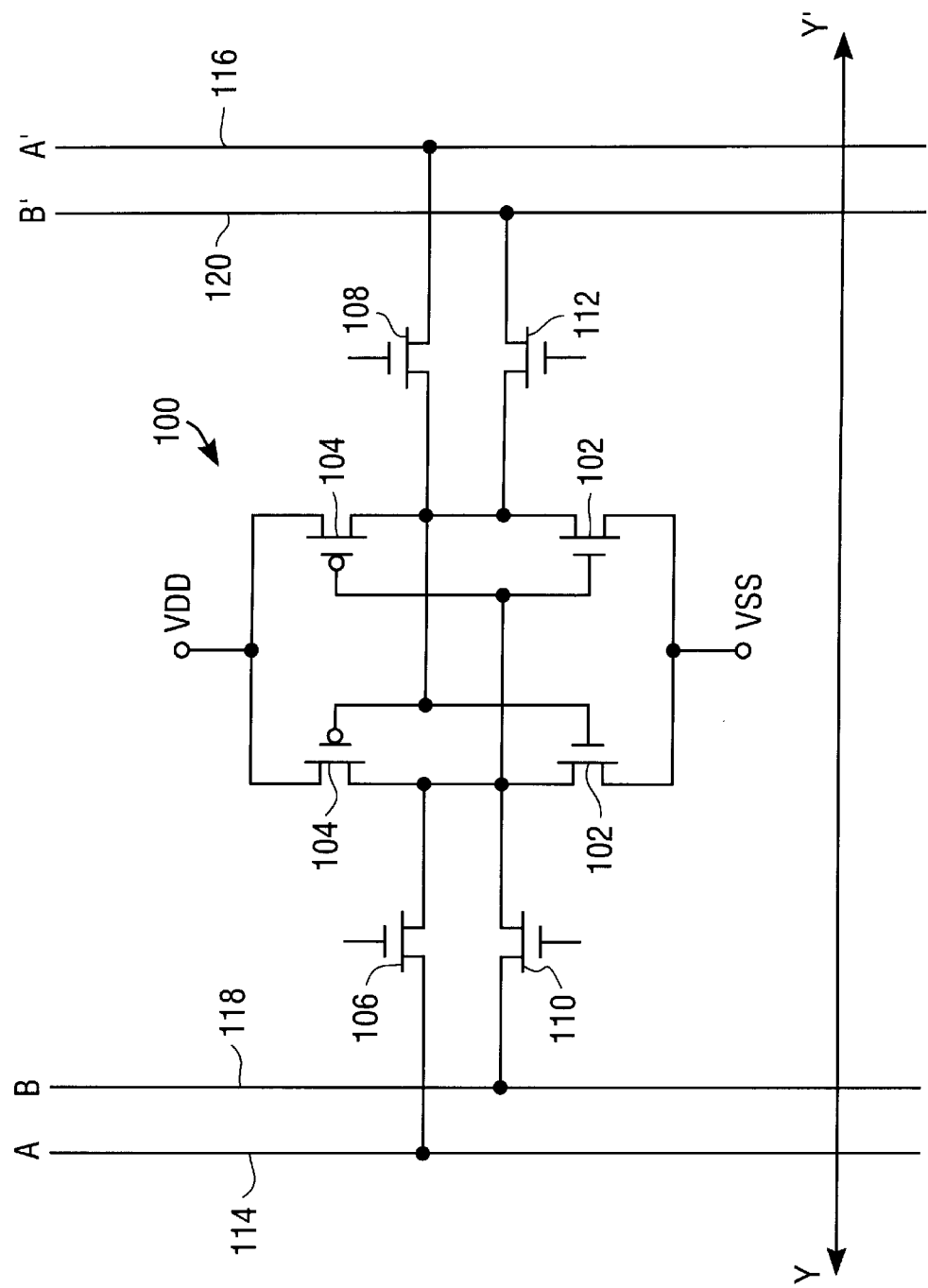
FIG. 1 is a schematic diagram of a prior art dual port SRAM memory cell.
Figure 2:
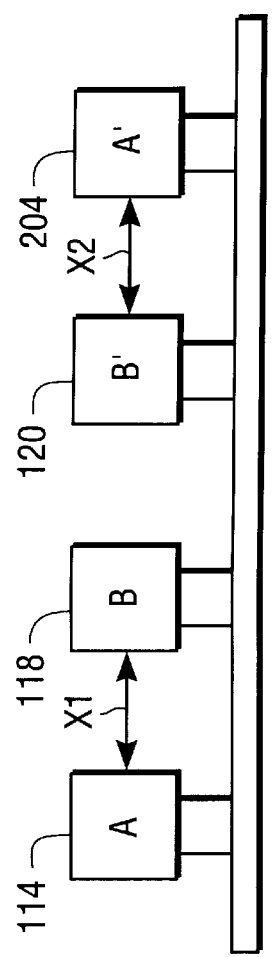
FIG. 2 is a block diagram of a cross section of the dual port memory cell of FIG. 1 in the Y–Y' direction.
Figure 3:
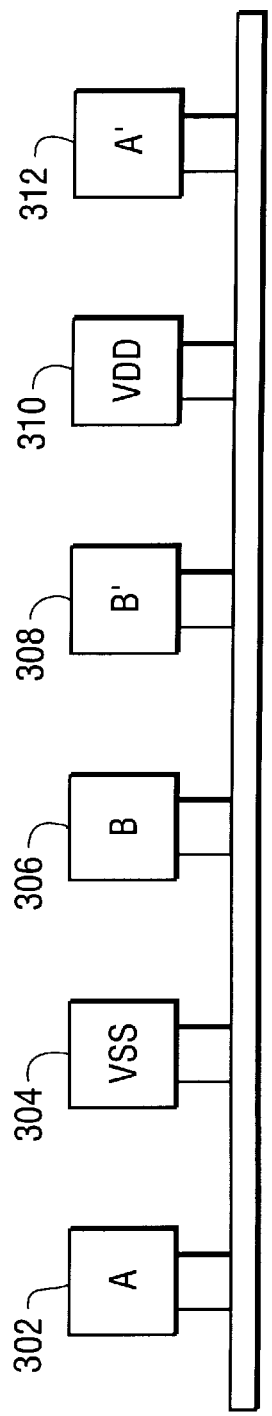
FIG. 3 is a block diagram of a cross section of a prior art dual port SRAM memory cell with horizontal shielding.
Figure 4:
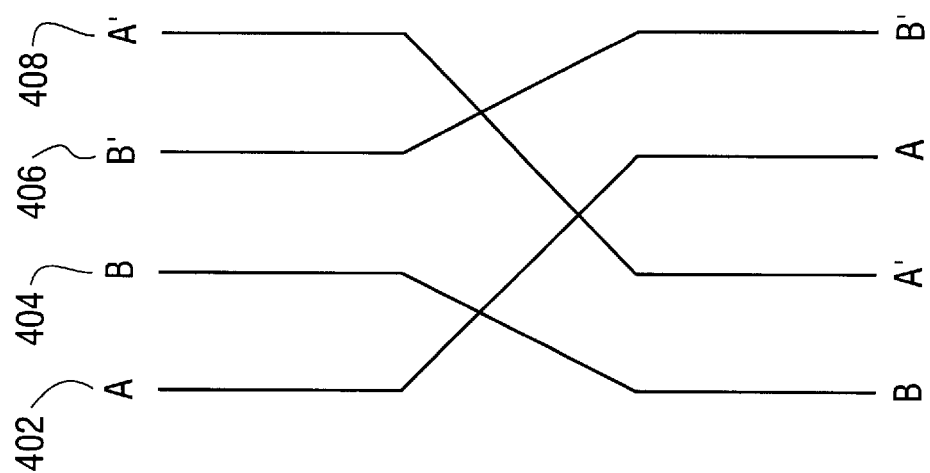
FIG. 4 is a top schematic view of a prior art crossover scheme in accordance with U.S. Pat. No. 5,287,322.
Figure 5:
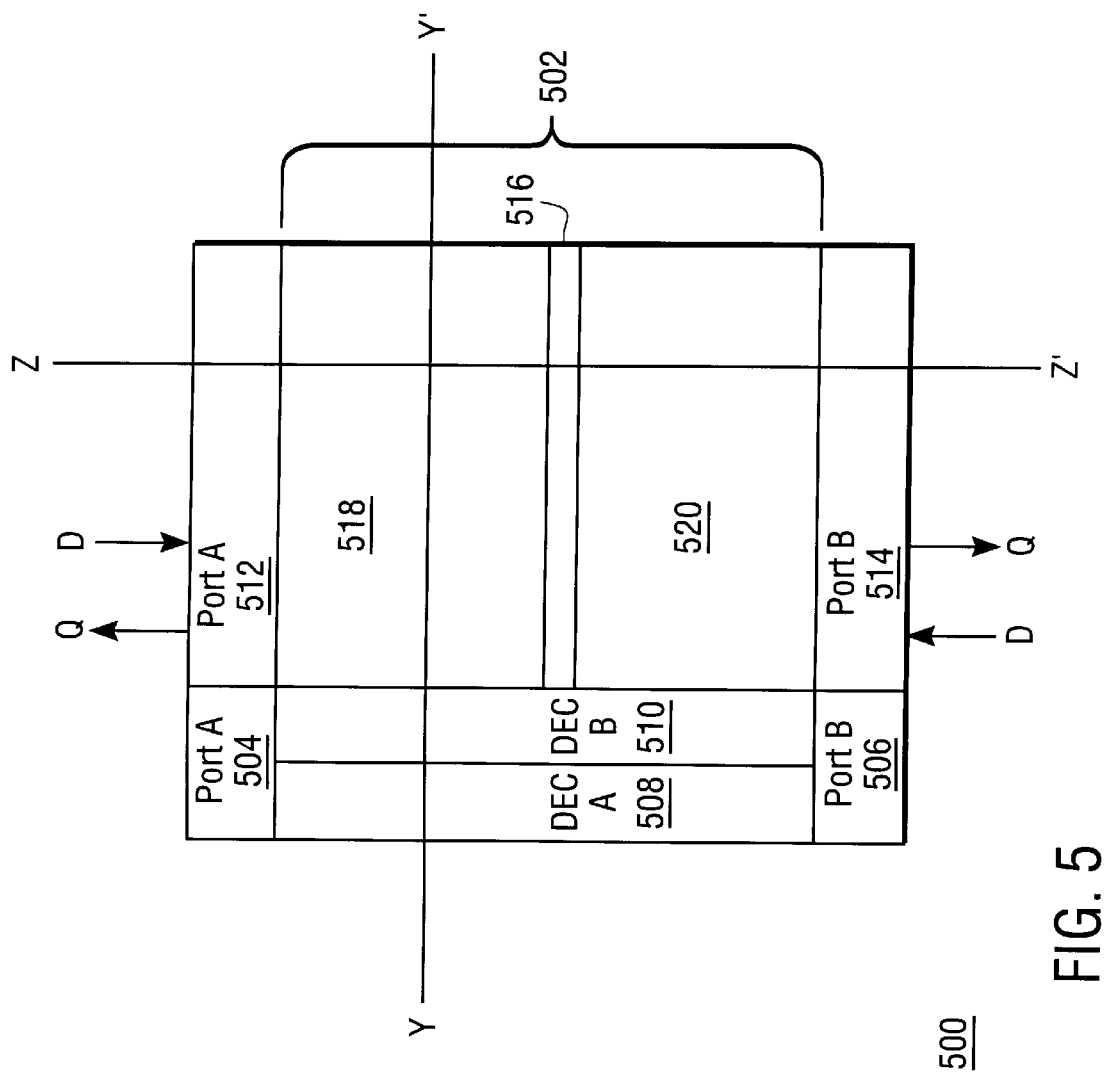
FIG. 5 is a block diagram of a dual port memory device in accordance with the present invention.

Referring now to FIG. 5, a block diagram of one embodiment of a dual port memory device 500 in accordance with the present invention is shown. Dual port memory device 500 is preferably a dual port SRAM comprising a memory array 502, control circuitry for a first port (Port A) 504, control circuitry for a second port (Port B) 506, decoder circuitry 508 for Port A, and decoder circuitry 510 for Port B. Port A decoder circuitry 508 and Port B decoder circuitry 510 are both coupled to the memory array 502. Memory array 502 comprises a plurality of memory cells for storing information in an arrangement of m rows and n columns which are capable of being randomly accessed by Port A and Port B. Device 500 also comprises input/output (I/O) circuitry 512, 514 for Port A and Port B respectively. Device 500 further comprises I/O lines (D and Q) and standard control signals (not shown), such as chip enable (CE), read/write (R/W), output enable (O/E) and address lines (ADDR). Such control signals are well known in the art and are therefore not further described herein. Dual port SRAM device 500 comprises two complete sets of decoding circuitry, control circuitry, and I/O circuitry for Port A and Port B and thus, can be accessed at the same time by the two independent sets of address, data, and control lines.

As shown in FIG. 5, the bit lines for the dual port memory device 100 run from top to bottom through the memory array 502 and terminate in sense amps (not shown). Sense amps are known in the art and include two complete sets of sense amplifiers, one for the bit lines for Port A and one for the bit lines for Port B. The sense amps are completely independent and asynchronous thus allowing Port A and Port B to independently read from and write to the memory array 502.

Figure 6:
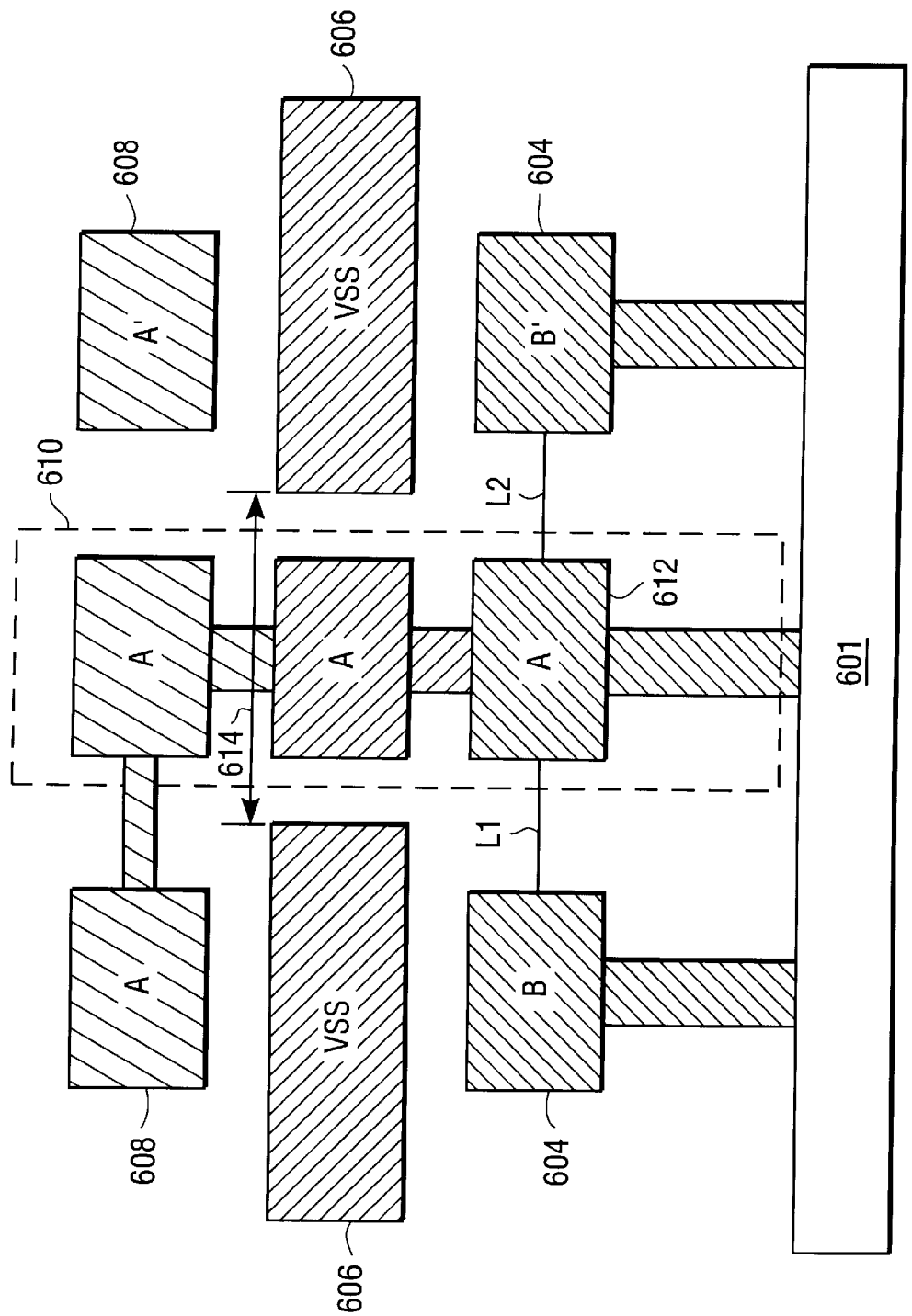
FIG. 6 is a block diagram of a cross-section of one embodiment of a dual port memory device in accordance with the present invention.

Referring now to FIG. 6, a block diagram of a cross-sectional view 600 of one embodiment of the dual port memory device 500 in accordance with the present invention is shown. The cross sectional view 600 is taken along the Y–Y' line of FIG. 5. One skilled in the art will appreciate that the cross-sectional view 600 of FIG. 6 represents only one section of dual port memory device 500 and therefore, the present invention is not limited to the specific cross-section illustrated. The cross-sectional view 600 comprises a substrate 601, a first metal layer 604, a second metal layer 606, and a third metal layer 608. The substrate 601 comprises individual transistors in the device as is well known in the art. The first metal layer 604, the second metal layer 606, and the third metal layer 608 provide electrical interconnections within the device. The first metal layer 604 is disposed above the substrate 601 of the device in conventional manner. As used herein, the term "above" is used with reference to a cross-sectional view of the device such as that shown in FIG. 6. In other words, a layer of dielectric material (not shown) is formed in conventional manner on the surface of substrate 601. The first metal layer 604 is then formed in conventional manner on the surface of the dielectric material thus resulting in the first metal layer 604 being disposed or located above the substrate 601. In a similar manner, the second metal layer 606 is disposed above the first metal layer 604, and the third metal layer 608 is disposed above the second metal layer 606.

The first metal layer 604 comprises a first group of bit lines for a first port of the two ports of the dual port SRAM device, and the third metal layer 608 comprises a second group of bit lines for a second port of the two ports of the dual port SRAM device. The first group of bit lines further comprises complemented and uncomplemented bit lines for the first port, and the second group of bit lines comprises complemented and uncomplemented bit lines for the second port. For example, if first metal layer 604 comprises the complemented and uncomplemented bit lines for Port B (B' and B), then the third metal layer 608 comprises the complemented and uncomplemented bit lines for Port A (A' and A) as illustrated in FIG. 6. Alternatively, if first metal layer 604 comprises the complemented and uncomplemented bit lines for Port A (A' and A), then the third metal layer 608 comprises the complemented and uncomplemented bit lines for Port B (B' and B).

The second metal layer 606 preferably comprises a vertical shielding layer for eliminating cross-coupling capacitances between the bit lines above the vertical shielding layer 606 and the bit lines below the vertical shielding layer 606. As used herein, the term "vertical" is used with reference to a cross sectional view of the device as shown in FIG. 6. When bit lines for Port A and bit line for Port B are located at different metal layers in a device without vertical shielding, the capacitance between the bit lines in the two different metal layers would be in the vertical direction. Thus, a vertical shielding layer refers to a shielding layer which eliminates the vertical capacitance between bit lines disposed in different metal layers.

Generally, vertical shielding layer 606 may comprise any signal line which will minimize the capacitance coupling between the Port A and Port B bit lines. For example, vertical shielding layer 606 may comprise signal lines such as power lines and local lines. For examples, vertical shielding layer 606 may comprise power supply lines such as VSS or VDD, lines coupled to the local nodes of the cell. Alternatively, vertical shielding layer 606 may comprise signal lines which run in a direction which is perpendicular to the direction in which the bit lines of Port A and Port B run.

Figure 7:
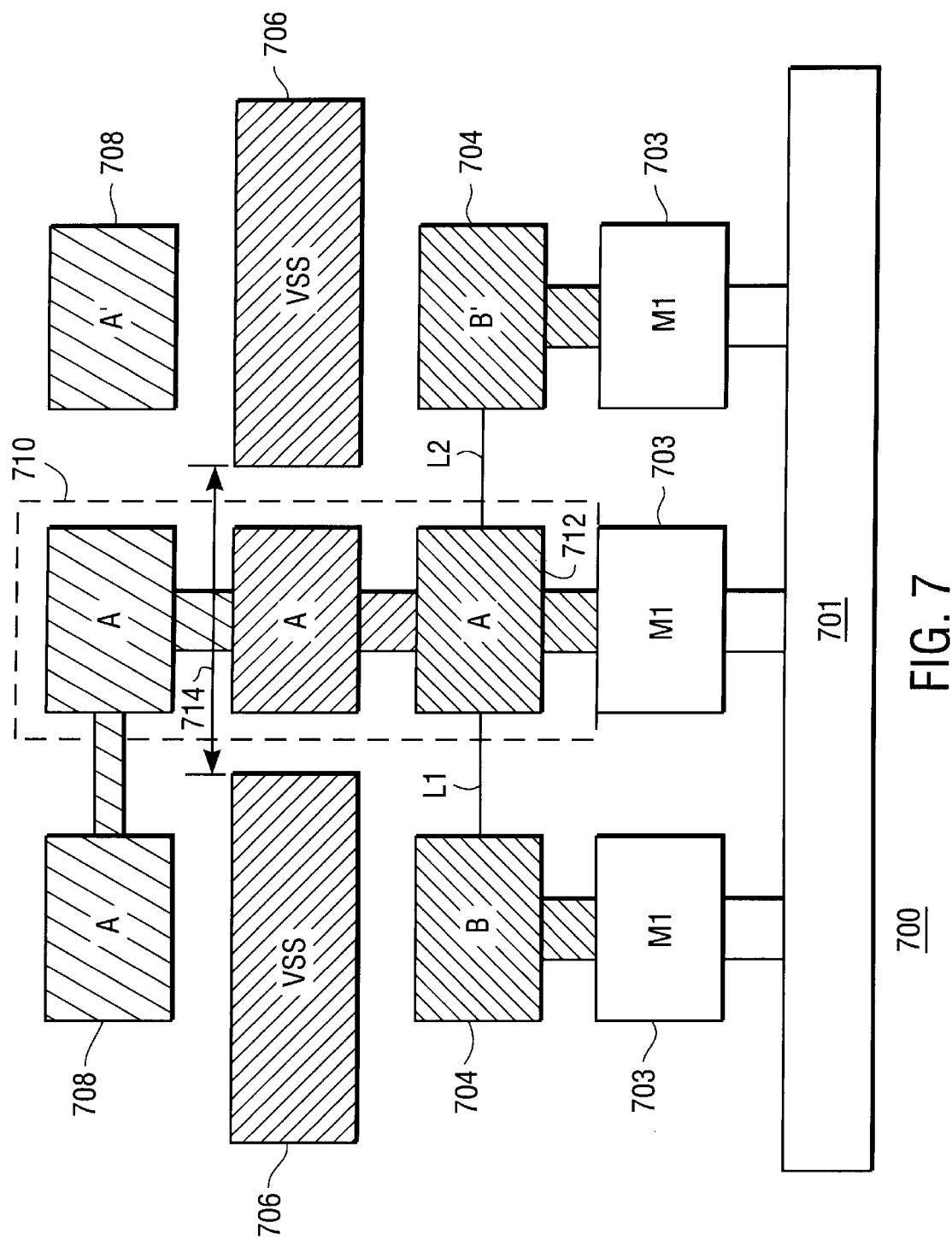
FIG. 7 is a block diagram of a cross-section of another embodiment of a dual port memory device in accordance with the present invention.

Although FIG. 6 illustrates only three metal layers, the teachings of the present invention are not limited to devices which utilize only three layers of metal. Referring now to FIG. 7, a block diagram of a cross-section of another embodiment of the present invention is shown. In such embodiment, a dual port SRAM device 700 comprises a substrate 701 and four layers of metal for providing interconnections within the device: first metal layer 703, second metal layer 704, third metal layer 706, and fourth metal layer 708. According to the teachings of the present invention, the location of the bit lines for Port A, the location of bit lines for Port B, and the vertical shielding layer are not limited to any specific metal layer. Rather, the present invention requires that 1) a first group of bit lines for the first port of the dual port SRAM device are located in one metal layer, 2) a second group of bit lines for the second port of the dual port SRAM device are located in a different metal layer, and 3) the vertical shielding layer is located between the metal layer comprising the bit lines for the first port and the metal layer comprising the bit lines for the second port. Preferably, as shown in FIG. 7, the second metal layer 704 comprises complemented and uncomplemented bit lines for Port B of the dual port SRAM device, the fourth metal layer 708 preferably comprises the complemented and uncomplemented bit lines for Port A of the dual port SRAM device, and the third metal layer 706 preferably comprises a vertical shielding layer for eliminating the capacitance coupling between the bit lines above the vertical shielding layer 706 and the bit lines below the vertical shielding layer 706. In an alternate embodiment, the first metal layer 703 may comprise the complemented and uncomplemented bit lines for Port A of the dual port SRAM device, the third metal layer 706 may comprise the complemented and uncomplemented bit lines for Port B of the dual port SRAM device, and the second metal layer 704 may comprise a vertical shielding layer for minimizing the capacitance coupling between the bit lines of Port A and Port B. One skilled in the art will realize that the present invention is not limited to devices having only three or four metal layers, but includes devices with any number of metal layers where three of those metal layers may be used to implement the present invention in the manner described above. In other words, in a device with n metal layers, 3 different metal layers of those n metal layers may be used to implement the present invention. Thus, one skilled in the art will realize that any number of permutations for implementing the present may be possible in devices with n metal layers.

Additionally, one skilled in the art will realize that the present invention is not limited to dual port SRAM devices but may include SRAM devices with any number of ports. For example, the present invention could be applied to a triple port SRAM device which comprises three sets of bit lines. In such embodiment, a vertical shielding layer is disposed a first set of bit lines and a second set of bit lines, and another vertical shielding layer is disposed between the second set of bit lines and a third set of bit lines. Thus, for an SRAM device with n sets of bit lines, n-1 vertical shielding layers are needed to provide vertical shielding for eliminating the cross coupling capacitance between bit lines above the vertical shielding layer and bit lines below the vertical shielding layer.

Referring again to FIG. 6, the present invention further comprises jumper or drop down lines 610 for electrically connecting the bit lines in the metal layer above the vertical shielding layer 606 to a diffusion area in substrate 601. The jumper lines 610 extend from the metal layer comprising the bit lines above the vertical shielding layer 606, through jumper windows 614 in the vertical shielding layer 606, to substrate 601. For example, if the bit lines for Port A are disposed above the vertical shielding layer 606 in the third metal layer 608, then jumper lines 610 for the bit lines for Port A extend from the third metal layer 608, through the vertical shielding layer 606 and the first metal layer 604, and to diffusion wells in the substrate 601 as illustrated in FIG. 6. The jumper windows 614 in the vertical shielding layer 606 are described below in more detail with reference to FIG. 8. Similarly, jumper or drop down lines 710 for electrically connecting the bit lines in the metal layer above the vertical shielding layer 706 to the metal layer below the vertical shielding layer 706 are illustrated in FIG. 7. The jumper lines 710 extend from the metal layer comprising the bit lines above the vertical shielding layer 706, through jumper windows 714 in the vertical shielding layer 706, to substrate 701 via an intervening metal one layer 703.

The segment 612 of the jumper lines 610 which is disposed in the same metal layer as the group of bit lines (hereinafter "the first group") disposed beneath the vertical shielding layer 606 is located a distance L1 and L2 from the bit lines of the first group which are immediately adjacent to the segment 612 of the jumper lines. For example, if the first group of bit lines disposed in the first metal layer 604 comprise bit lines for Port B and the jumper lines 610 electrically connect the bit lines for Port A disposed in the third metal layer 608, then the segment 612 of the jumper lines 610 disposed in the first metal layer 604 is a distance L1 from the adjacent bit line B and a distance L2 from the adjacent bit line B' as illustrated in FIG. 6. Preferably, L1 is equal to L2 to make the coupling equal to B and B'. Similarly, the segment 712 of the jumper lines 710 which is disposed in the same metal layer as the group of bit lines (hereinafter "the first group") disposed beneath the vertical shielding layer 706 is located a distance L1 and L2 from the bit lines of the first group which are immediately adjacent to the segment 712 of the jumper lines.

In a preferred embodiment, for an individual cell in the memory array 502 of the dual port SRAM device 500, there is one jumper line 610 for the complemented bit line disposed above the vertical shielding layer 606 and one jumper line 610 for the uncomplemented bit line disposed above the vertical shielding layer 606. Alternatively, within one memory cell of the device 500, there may be more than one jumper line 610 for the complemented bit line disposed above the vertical shielding layer 606, and there may be more than one jumper line 610 for the uncomplemented bit line disposed above the vertical shielding layer 606. For each jumper line 610 for a second group of bit lines, the segment 612 of the jumper line 610 is approximately an equal distance from the immediately adjacent bit lines of the first group of bit lines.

Figure 8:
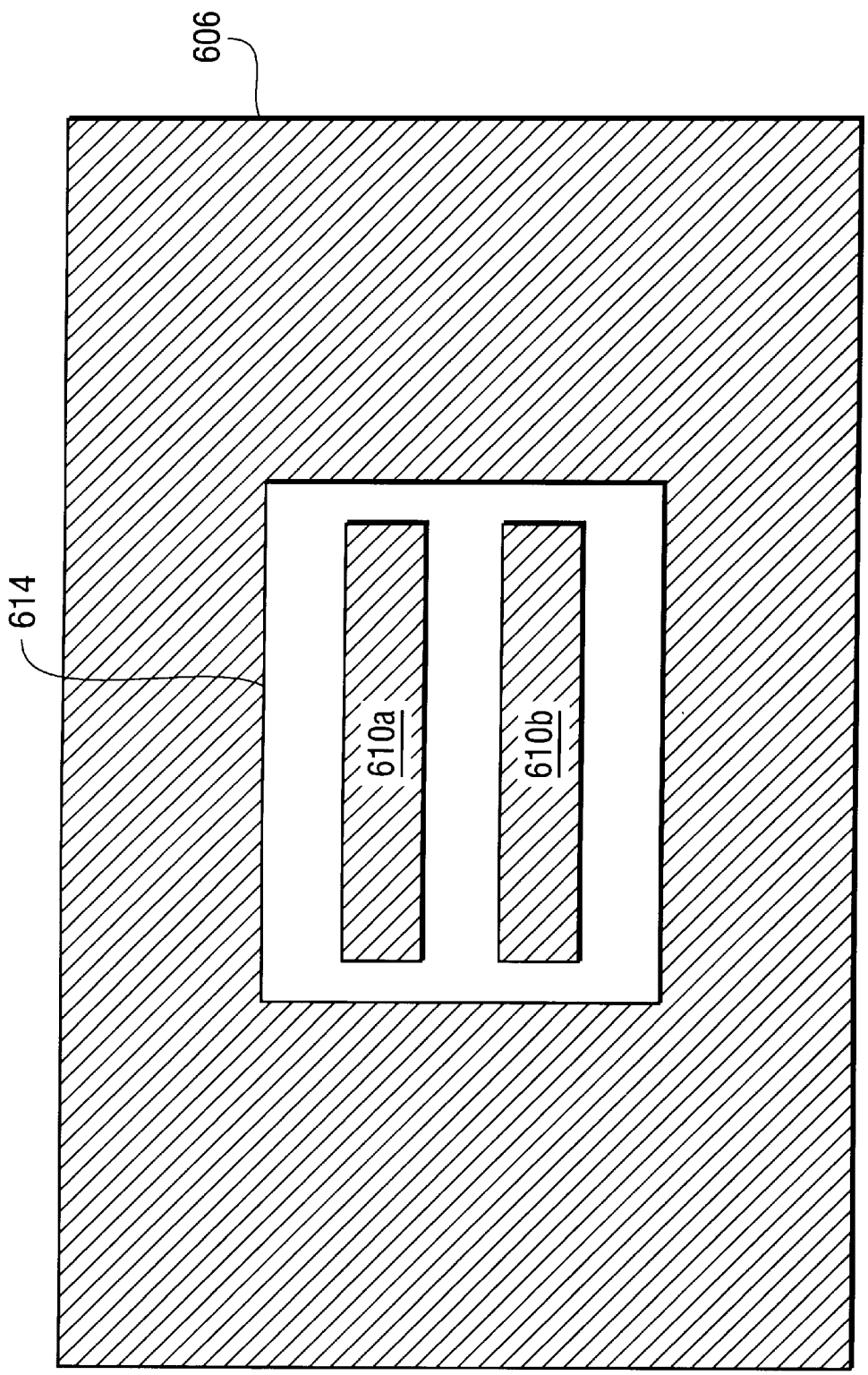
FIG. 8 is a top plan view of one embodiment of a vertical shielding layer in accordance with the present invention.

Referring now to FIG. 8, a top plan view of a vertical shielding layer in accordance with the present invention is shown. A vertical shielding layer 606 comprises jumper windows 614 for allowing the jumper lines 610 to pass through the vertical connectivity shielding layer 606. In a preferred embodiment, an individual cell in memory array 502 comprises a single jumper window 614 for allowing two jumper lines 610A and 610B to pass through the vertical shielding layer 606. Alternatively, there may be more than one jumper window 614 in the vertical shielding layer 606 for an individual cell in memory array 502. Additionally, there may be only one jumper line 610 passing through a jumper window 614 or there may be more than one jumper line 610 passing through a jumper window 614.

Thus, the present invention provides a layout and design for a dual port memory device which minimizes problems caused by stray and cross-coupling capacitances. More specifically, a vertical shielding layer is used to eliminate cross-coupling capacitances between bit lines located above the vertical shielding layer and bit lines located below the vertical shielding layer thereby improving device speed. Additionally, the layout and design of the present invention is flexible and simple to implement and does not add undue complication to the overall device design. The present invention can be adapted to current technologies and does not increase the die size of the device.

In device 500 of the present invention, the I/O interfaces for Port A and for Port B are located at separate metal layers. For example, if the bit lines for Port A are disposed in the third metal layer 608 as shown in FIG. 6, then the interface between the Port A bit lines and the I/O is disposed at the third metal layer 608. In the same example, the bit lines for Port B are disposed in the first metal layer 604 resulting in an interface between the Port B bit lines and the I/O which is disposed at the first metal layer 604. Accordingly, the capacitances of the A and A' bit lines are not balanced with the capacitances of the B and B' bit lines since the A and A' bit lines are disposed at a different metal layer from the B and B' bit lines. Therefore, in a preferred embodiment of the invention, the device 500 may also include a bit line crossover region in the memory array 502. Referring back to FIG. 5, a bit line crossover region 516 in accordance with a preferred embodiment of the invention is shown. The bit line crossover region 516 separates the memory array 512 into two separate array regions, 518 and 520. As the bit lines run from top to bottom through the array 512, the bit lines are crossed in the bit line crossover region 516. In other words, if the bit lines for Port A are disposed in the third metal layer 608 in array region 518, and the bit lines for Port B are disposed in the first metal layer 604 in array region 518, then the bit lines for Port A and Port B are crossed in the bit line crossover region 516 such that in array region 520, the bit lines for Port A are now disposed in the first metal layer 604 and the bit lines for Port B are now disposed in the third metal layer 608. This bit line crossover region 516 balances the capacitances between the A and A' bit lines and the B and B' bit lines, thereby increasing the maximum operating speed of the device. One skilled in the art will realize that the present invention is not limited to only two array regions 518 and 520, but that the memory array 502 may be separated into any number of regions where the bit lines are crossed over in the bit lines crossover region 516.

While the present invention has been particularly shown and described with reference to preferred embodiments, those skilled in the art will understand that various changes in form and detail may be made therein without departing from the spirit and scope of the present invention.

What is claimed is:

1. A dual port memory device comprising:
   a plurality of bit lines traversing the device along a line in a first direction, said plurality of bit lines being grouped into a first group of bit lines corresponding to a first port and a second group of bit lines corresponding to a second port, said first group of bit lines and said second group of bit lines being disposed in different metal layers; and
   a vertical shielding layer disposed between the different metal layers in which the first group of bit lines and the second group of bit lines are disposed, for eliminating the coupling between the first group and the second group.

2. The device of claim 1 further comprising:
   a first metal layer;
   a second metal layer disposed above the first metal layer; and
   a third metal layer disposed above the second metal layer;
   wherein the first group of bit lines is disposed in the first metal layer, the vertical shielding layer is disposed in the second metal layer, and the second group of bit lines is disposed in the third metal layer.

3. The device of claim 2 further comprising:
   an array of memory cells wherein the first group of bit lines and the second group of bit lines connect to each cell in said array;
   jumper lines for connecting the second group of bit lines to each cell in said array; and
   jumper windows disposed in the vertical shielding layer for providing an opening for the jumper lines for connecting the second group of bit lines to each cell in said array.

4. The device of claim 3 wherein the first group of bit lines in the first metal layer adjacent to the jumper lines are disposed an equal distance from the jumper lines.

5. The device of claim 1 wherein the vertical shielding layer comprises signal lines traversing the device in a second direction perpendicular to the first direction.

6. The device of claim 1 wherein the vertical shielding layer comprises a VDD or VSS power supply.

7. The device of claim 1 further comprising:
   a bit lines crossover region.

8. A dual port memory device comprising:
   a first plurality of bit lines disposed in a first metal layer and associated with a first port;
   a vertical shielding layer disposed in a second metal layer, said second metal layer disposed above the first metal layer; and
   a second plurality of bit lines disposed in a third metal layer and associated with a second port; said third metal layer disposed above the second metal layer.

9. The device of claim 8 wherein the vertical shielding layer comprises a power supply line.

10. The device of claim 8 wherein the vertical shielding layer comprises a ground line.

11. The device of claim 8 wherein the first plurality of bit lines and the second plurality of bit lines traverse the device along a line in a first direction, and the vertical shielding layer comprises signal lines traversing the device along a line in a second direction, the second direction being disposed in a direction which is not parallel to the first direction.

12. The device of claim 8 further comprising:
   an array of memory cells wherein each cell of the array is accessible by the first plurality of bit lines and by the second plurality of bit lines; and
   jumper lines for connecting the second plurality of bit lines to each cell in said array.

13. The device of claim 12 further comprising:
   jumper windows disposed in the vertical shielding layer for allowing the jumper lines to pass through the vertical shielding layer.

14. The device of claim 12 wherein the first plurality of bit lines adjacent to the jumper lines are disposed an equal distance from the jumper lines.

15. The device of claim 8 further comprising:
a bit line crossover region.

16. A dual port memory cell comprising:
a first plurality of bit lines disposed in a first metal layer and associated with a first port, said first plurality of bit lines comprising complemented and uncomplemented bit lines connected to the cell;
a vertical shielding layer disposed in a second metal layer, said second metal layer disposed above the first metal layer;
a second plurality of bit lines disposed in a third metal layer and associated with a second port; said third metal layer disposed above the second metal layer, said second plurality of bit lines comprising complemented and uncomplemented bit lines; and
jumper lines for connecting the second plurality of bit lines to the cell.

17. The device of claim 16 wherein the jumper lines further comprise:
a complemented jumper line for connecting the complemented bit lines of the second plurality of bit lines to the cell; and
an uncomplemented jumper line for connecting the uncomplemented bit lines of the second plurality of bit lines to the cell.

18. The device of claim 16 further comprising:
jumper windows disposed in the vertical shielding layer for allowing the jumper lines to pass through the vertical shielding layer.

19. The device of claim 16 wherein the first plurality of bit lines and the second plurality of bit lines traverse the cell along a line in a first direction, and the vertical shielding layer comprises signal lines traversing the cell along a line in a second direction, the second direction being disposed in a direction which is not parallel to the first direction.

20. The device of claim 16 wherein the complemented bit lines of the first plurality of bit lines adjacent to the jumper lines in the first metal layer and the uncomplemented bit lines of the first plurality of bit lines adjacent to the jumper lines in the first metal layer are disposed a symmetrical distance from the jumper lines.

* * * * *